United States Patent
Queens et al.

(10) Patent No.: US 10,274,849 B2
(45) Date of Patent: Apr. 30, 2019

(54) METHODS FOR CONTROLLING LITHOGRAPHIC APPARATUS, LITHOGRAPHIC APPARATUS AND DEVICE MANUFACTURING METHOD

(71) Applicant: ASML NETHERLANDS B.V., Veldhoven (NL)

(72) Inventors: Rene Marinus Gerardus Johan Queens, Boise, ID (US); Erik Johan Koop, Eindhoven (NL); Reiner Maria Jungblut, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/743,661

(22) PCT Filed: Jul. 5, 2016

(86) PCT No.: PCT/EP2016/065834
§ 371 (c)(1),
(2) Date: Jan. 10, 2018

(87) PCT Pub. No.: WO2017/012859
PCT Pub. Date: Jan. 26, 2017

(65) Prior Publication Data
US 2018/0210351 A1 Jul. 26, 2018

(30) Foreign Application Priority Data
Jul. 20, 2015 (EP) .................................. 15177572

(51) Int. Cl.
*G03F 9/00* (2006.01)
*G03F 7/20* (2006.01)

(52) U.S. Cl.
CPC ........ *G03F 9/7026* (2013.01); *G03F 7/70616* (2013.01); *G03F 9/7034* (2013.01); *G03F 9/7046* (2013.01); *G03F 9/7049* (2013.01)

(58) Field of Classification Search
CPC ............. G03F 7/70641; G03F 7/70616; G03F 9/7026; G03F 9/7049
(Continued)

(56) References Cited

U.S. PATENT DOCUMENTS

| 5,748,323 A | 5/1998 | Levinson |
| 6,674,510 B1 * | 1/2004 | Jasper ....................... G03F 9/70 355/53 |

(Continued)

FOREIGN PATENT DOCUMENTS

| WO | 2015/104074 | 7/2015 |
| WO | 2015/131969 | 9/2015 |

OTHER PUBLICATIONS

International Search Report and Written Opinion dated Oct. 21, 2016 in corresponding International Patent Application No. PCT/EP2016/065834.

*Primary Examiner* — Hung Nguyen
(74) *Attorney, Agent, or Firm* — Pillsbury Winthrop Shaw Pittman LLP

(57) ABSTRACT

A lithographic apparatus applies a device pattern at multiple fields across a substrate. A height map is decomposed into a plurality of components. A first height map component represents topographical variations associated with the device pattern. One or more further height map components represent other topographical variations. Using each height map component, control set-points are calculated according to a control algorithm specific to each component. The control set-points calculated for the different height map components are then combined and used to control imaging of the device pattern to the substrate. The specific control (Continued)

algorithms can be different from one another, and may have differing degrees of nonlinearity. The combining of the different set-points can be linear. Focus control in the presence of device-specific topography and other local variations can be improved.

20 Claims, 5 Drawing Sheets

(58) Field of Classification Search
USPC .......................................... 355/52, 53, 55, 67
See application file for complete search history.

(56) References Cited

U.S. PATENT DOCUMENTS

| | | |
|---|---|---|
| 7,265,364 B2 | 9/2007 | Teunissen et al. |
| 8,842,293 B2 | 9/2014 | Den Boef et al. |
| 9,488,465 B2 | 11/2016 | Khuat et al. |
| 2005/0259272 A1* | 11/2005 | Wang ................. G01B 11/0608 356/601 |
| 2010/0110401 A1 | 5/2010 | Chung |
| 2010/0233600 A1 | 9/2010 | Den Boef et al. |
| 2011/0109889 A1* | 5/2011 | Van De Vin ........... G03B 27/58 355/55 |
| 2013/0128247 A1 | 5/2013 | Khuat et al. |

* cited by examiner

METHODS FOR CONTROLLING LITHOGRAPHIC APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2016/065834, which was filed on Jul. 5, 2016, which claims priority of European patent application no. 15177572.3, which was filed on Jul. 20, 2015, and which is incorporated herein in its entirety by reference.

BACKGROUND

Field of the Invention

The present disclosure relates to lithographic apparatus. The disclosure relates in particular to the control of lithographic apparatus using height maps. The disclosure further relates to methods of manufacturing devices by lithography, and to data processing apparatuses and computer program products for implementing parts of such apparatus and methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a grid of adjacent target portions referred to as "fields" that are successively patterned. Known lithographic apparatus include so-called steppers, in which each field is irradiated by exposing an entire field pattern onto the field at one time, and so-called scanners, in which each field is irradiated by scanning the field pattern through a radiation beam in a given direction (the "scanning"-direction) while synchronously scanning the substrate parallel or anti-parallel to this direction.

The pattern is imaged onto the target portion of the substrate using lenses (or mirrors) forming a projection system. When imaging the pattern onto the substrate it is desirable to ensure that an uppermost surface of the substrate (i.e. the surface onto which the pattern is to be imaged) lies within the focal plane of the projection system.

The surface of a substrate on which a pattern should be projected is never perfectly flat, but presents many height deviations on both a large scale and smaller scale. Failure to adjust the focus of the projection system may result in poor patterning performance and consequently poor performance of the manufacturing process as a whole. Performance parameters such as critical dimension (CD) and CD uniformity in particular will be degraded by poor focus.

To measure these height deviations, height sensors are normally integrated in the lithographic apparatus. These are typically optical sensors used to measure and the vertical position of the uppermost surface of the substrate at points all across the substrate, after it has been loaded into the lithographic apparatus. This set of measurements is stored in some suitable form and may be referred to as a "height map". The height map is then used when controlling imaging of the pattern onto the substrate, to ensure that the radiation sensitive resist layer on each portion of the substrate lies in the focal plane of the projection lens. Typically the height of a substrate support bearing the substrate will be adjusted continuously during exposure of successive portions on a substrate. Examples of height sensors are disclosed in U.S. Pat. No. 7,265,364 B2, US 20100233600 A1 and US 2013128247 A. They do not need to be described in detail herein. Corrections to the height map may be made using other sensor measurements (for example an air gauge) to reduce process dependency of the measurements. According to patent application EP14157664.5, not published at the present priority date, further corrections can be applied to the height map based on prior knowledge of product design and process dependency.

A number of problems may arise when controlling focus of the projection system using height map data. In a scanning mode of lithography, a slit-shaped "aerial image" is formed and scanned over a field area to apply the field pattern. Height and tilt parameters of the aerial image are adjusted dynamically to optimize focus performance throughout the scan. A known problem in lithography is that the substrate and/or the substrate support may exhibit local topographical variations that are challenging for the focus controller. Such local variations may be, for example, a bump due to contamination beneath the substrate. Another type of local variation is a dip (hole) due to a gap in the "burls" that support the substrate. Other local variations are associated with the substrate edge. The term "edge roll-off" has been coined to refer to some types of edge topography phenomenon. Any non-device specific topography related to the edge region of the substrate, as well as local variations at any region of the substrate, should be considered as relevant for the present disclosure.

The normal control algorithms of the imaging operation may be unable to achieve the best focus across such local variations. For such cases, differently weighted algorithms may be considered. On the other hand, there are also occasions when local variations are to be de-weighted, if focus performance and yield are to be optimized. An example of such a situation is when the substrate is subject to device-specific topographical variations. Some designs and processes yield a pattern of topographical variations due to different processes and materials used at different parts of the device. Modern device types such as 3-D NAND memory devices are an example. Even where there is not a great actual topographic variation, differences in optical properties of materials can lead to a large apparent topographical variation, when read by the height sensor. In cases with such significant device-specific topography, it is generally desired for the focus control algorithm to be insensitive to the local variations. This can be true not only for apparent variations caused by process dependency of the height sensor, but also for real topography variations. This is because trying to follow short-range (high spatial frequency) variations generally worsens the dynamic performance of the imaging system. Therefore, even if this insensitivity leads to defocus as topography is less accurately followed, it may still yield a net focus gain.

Unfortunately the same types of device that exhibit extreme device-specific topography may also be particularly susceptible to bumps, holes and edge effects in the substrate.

In any case, there are increasingly conflicting requirements for the operator seeking to optimize focus control for some modern semiconductor products. The operator struggles to achieve an optimum focus control algorithm. To a large extent, in these cases there simply is no optimum algorithm, among those available.

SUMMARY OF THE INVENTION

It is desirable to improve performance of lithographic manufacturing processes in the presence of both device-specific topography and localized effects such as bumps and holes. It is a particular aim of the present disclosure to address the problem of focus control when imaging patterns on such substrates. It is another aim of the disclosure to enable simpler operation of lithographic apparatus, and in particular to simplify the selection of an optimized focus control algorithm.

The invention in a first aspect provides a method of controlling a lithographic apparatus to manufacture a plurality of devices on a substrate, the method comprising:
(a) obtaining a height map representing a topographical variation across the substrate; and
(b) using the height map to control a positioning system of the lithographic apparatus for applying a device pattern at multiple locations across the substrate
wherein step (b) comprises:
(b1) decomposing the height map into a plurality of components, including a first height map component representing topographical variations associated with the device pattern and one or more further height map components representing other topographical variations;
(b2) using each height map component, calculating control set-points according to a control algorithm specific to each component; and
(b3) combining the control set-points calculated for the first height map component and the further height map component(s) and using the combined set-points to control the positioning system to apply the device pattern to the substrate.

The invention in a second aspect provides an apparatus for controlling a positioning system of a lithographic apparatus for applying a device pattern at multiple locations across a substrate, the apparatus comprising a data processing apparatus programmed to perform the steps of:
receiving a height map of a substrate that has been subjected to lithographic processing over a plurality of device areas;
decomposing the height map into a plurality of components, including a first height map component representing topographical variations associated with the device pattern and one or more further height map components representing other topographical variations;
using each height map component, calculating control set-points according to a control algorithm specific to each component; and
combining the control set-points calculated for the first height map component and the further height map component(s) and
providing set-points to control the positioning system to apply the device pattern to the substrate.

In accordance with the above aspects of the present disclosure, a focus control method can be implemented that has different response characteristics to device-specific topography compared with other topography (such as holes or focus spots). In particular embodiments, a first control algorithm applied to the device-specific component can be designed not to apply a great weight to extreme height values, while a second control algorithm applied to the other topographical variations can apply a greater weight to extreme values.

In an extreme example, the focus control may be performed without using the device specific component to calculate control set-points at all. Accordingly, the invention in a third aspect provides a method of controlling a lithographic apparatus to manufacture a plurality of devices on a substrate, the method comprising:
(a) obtaining a height map representing a topographical variation across the substrate; and
(b) using the height map to control a positioning system of the lithographic apparatus for applying a device pattern at multiple locations across the substrate
wherein step (b) comprises:
(b1) subtracting from the height map a first height map component representing topographical variations associated with the device pattern so as to obtain one or more further height map components representing other topographical variations;
(b2) using the obtained height map component(s), calculating control set-points according to a control algorithm specific to the other topographical variations; and
(b3) using the calculated set-points to control the positioning system to apply the device pattern to the substrate.

The invention in a fourth aspect provides an apparatus for controlling a positioning system of a lithographic apparatus for applying a device pattern at multiple locations across a substrate, the apparatus comprising a data processing apparatus programmed to perform the steps of:
receiving a height map of a substrate that has been subjected to lithographic processing over a plurality of device areas;
subtracting from the height map a first height map component representing topographical variations associated with the device pattern so as to obtain one or more further height map components representing other topographical variations;
using the obtained height map component(s), calculating control set-points according to a control algorithm specific to the other topographical variations; and
combining the control set-points calculated for the first height map component and the further height map component(s) and
providing set-points to control the positioning system to apply the device pattern to the substrate.

The third and fourth aspects of the invention are therefore special cases of the first and second aspects, which may be used when device-specific topography is to be ignored. The applicant reserves the right to claim these aspects independently.

The invention yet further provides a lithographic apparatus comprising a projection system and positioning system for positioning a patterning device and substrate in relation to the projection system for applying a pattern to a substrate, the lithographic apparatus including apparatus for controlling the positioning system in accordance with the first and/or second aspect of the invention as set forth above.

The invention yet further provides a computer program product comprising machine readable instructions for causing a general purpose data processing apparatus to perform the steps of the method of the first aspect of the invention as set forth above.

The invention yet further provides a computer program product comprising machine readable instructions for causing a general purpose data processing apparatus to implement the apparatus of the second aspect of the invention as set forth above.

The computer program product in either case may comprises a non-transitory storage medium.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Figure 1:
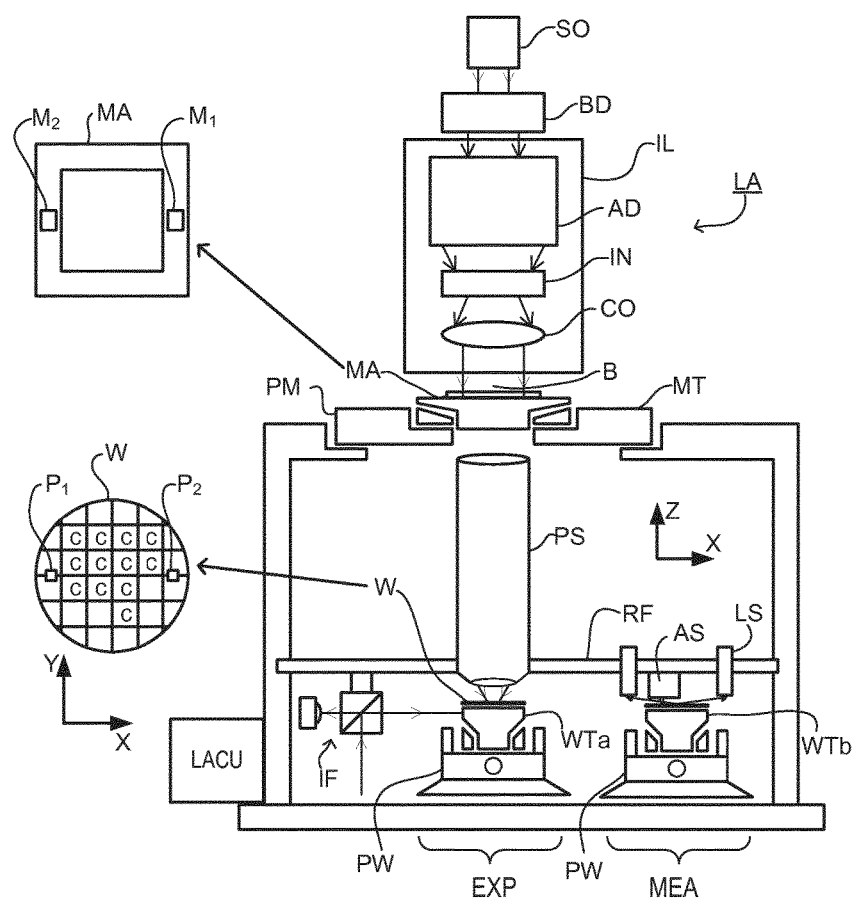
FIG. 1 depicts a lithographic apparatus according to an embodiment of the invention.

FIG. 1 schematically depicts a lithographic apparatus LA. The apparatus comprises:

an illumination system (illuminator) IL configured to condition a radiation beam B (e.g. UV radiation or EUV radiation).

a support structure (e.g. a mask table) MT constructed to support a patterning device (e.g. a mask or reticle) MA and connected to a first positioner PM configured to accurately position the patterning device in accordance with certain parameters;

a substrate table (e.g. a wafer table) WTa or WTb constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device (or a number of devices) being created in the target portion, such as an integrated circuit. The patterning device may be transmissive or reflective. Examples of patterning devices include masks, programmable mirror arrays, and programmable LCD panels.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander.

In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (fields), and/or between device areas (dies) within target portions. These are known as scribe-lane alignment marks, because individual product dies will eventually be cut from one another by scribing along these lines. Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface height of the substrate using a height sensor LS and measuring the position of alignment marks on the substrate using an alignment sensor AS. The measurement is time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
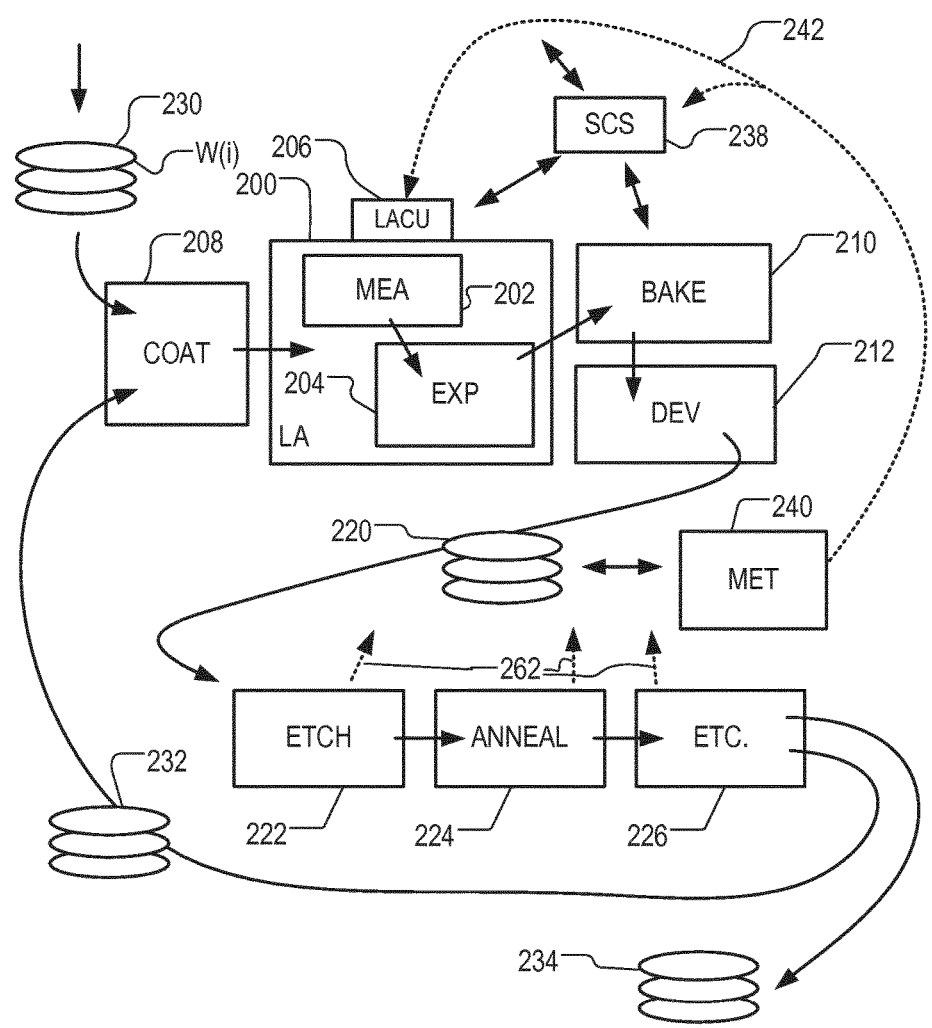
FIG. 2 shows schematically the use of the lithographic apparatus of FIG. 1 together with other apparatuses forming a production facility for semiconductor devices.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

The whole facility may be operated under control of a supervisory control system 238, which receives metrology data, design data, process recipes and the like. Supervisory control system 238 issues commands to each of the apparatuses to implement the manufacturing process on one or more batches of substrates.

Also shown in FIG. 2 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 3:
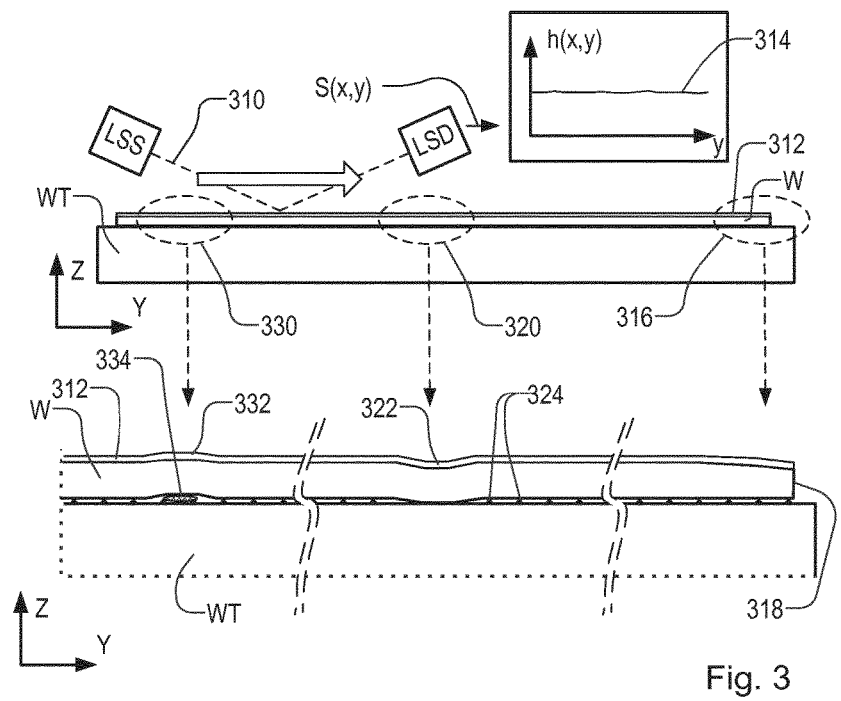
FIG. 3 illustrates schematically the operation of a height sensor and various phenomena of localized topographical variations on an example substrate in the lithographic apparatus of FIG. 1.

Referring now to FIG. 3, it was mentioned above that a preliminary step in the operation of a lithographic apparatus is for a map of substrate height to be obtained by measuring surface position in the Z direction against X-Y position. This height map may be obtained for example using the height sensor LS in the lithographic apparatus of FIG. 1, after the substrate has been clamped to one of the substrate supports WTa and WTb. The height map is used during patterning to achieve accurate focusing of an image of the patterning device MA onto the substrate. A substrate support is labeled WT, and carries a substrate W. The height sensor LS is in this example an optical sensor, comprising a source side optics LSS, and detector optics LSD. Other types of height sensors including for example air gauge sensors are known, which may be used instead of or in combination with the optical sensor. (For example, an air gauge sensor may be used as a process-independent measurement by which measurements from the optical sensor LS can be calibrated). Alternatively metrology tools outside the lithographic apparatus may be used to determine a topography within the die. Even further alternatively, (different layers of) design data may be used (alone or in combination with already indicated techniques) to estimate the device topography. In such an embodiment, the estimation of the topography may be done on data alone, without direct measurements on the substrate W.

In operation, source side optics LSS generates one or more beams of radiation (light) 310 that impinge onto a substrate W. Substrate W typically has different layers formed on it, and typically many more layers than are illustrated here. A top layer will normally be the resist layer 312 in which a pattern is to be formed. Below that will be an anti-reflective coating and below that will be potentially many layers of device features formed in different layouts and materials.

The beam of light 310 is reflected by the substrate and detected by detector side optics LSD to obtain one or more signals S(x,y) from which a measurement of the surface height at a position (x,y) on the substrate can be derived. By measuring height at numerous positions across the substrate, a height map h(x,y) can be obtained by a suitable processor in control unit LACU. The height map is then used when the substrate is in the exposure station EXP, to control focus and other parameters in the operation of the lithographic apparatus. The details of these optics for height sensing, as well as the associated signal processing, are known in the art and described for example in the prior publications mentioned in the introduction. They will not be described herein in detail. The radiation used in the present examples may be monochromatic, polychromatic and/or broadband. It may be P- or S-polarized, circularly polarized and/or unpolarized.

The sensor signals and/or the resulting height map may be subject to various corrections before being used to control focusing. As mentioned, for example, calibrations may be applied based on process-independent measurements made using an air gauge or the like. Corrections to reduce process dependency can also be applied based on knowledge of the product design and processing. This is described further in patent application EP14157664.5, mentioned above.

The height map h(x,y) can take any suitable form. In a simple embodiment, the height map comprises a two-dimensional array of sample values indexed by the X and Y coordinates of position across the substrate. In other embodiments, the height values could be expressed by parametric curves, fitted to measured sample values. A graph 314 of h(x,y) in FIG. 3 represents height values in a single slice, for example extending in the Y direction with a certain X value.

Over most of the substrate surface, height variations are conventionally relatively gentle, both in extent and their degree of localization (spatial frequency). In the enlarged detail at the bottom of FIG. 3, however, some different types of height anomalies are illustrated that can be found as localized topographical variations in a real process. For example, a steeper variation may arise in a region 316 towards the edge 318 of the substrate, in a peripheral region of the substrate. The variation near the substrate edge can have many causes. Non-uniformity leading to edge effects may arise in the manufacture of the original substrate W, and even in the manufacture of the substrate support WT itself. Subsequently, variations in etching, CMP and the like may accumulate layer-by-layer so that a phenomenon known as "edge roll-off" becomes quite pronounced. Although the term "roll-off" naturally implies a downward slope in surface height towards the edge, as illustrated in FIG. 3, an upward slope could occur, with the same results. Furthermore, although the phenomenon of edge roll-off will be referred to in the present disclosure as an example, the disclosure applies equally to any non-device specific topography related to the edge region of the substrate. For example there may be height steps in exposed fields that neighbor non-exposed edge fields.

In another region 320, a dip or hole 322 can be seen in the surface. This can have a number of causes. In a particular example, the hole may arise at a location where there is a gap in the pattern of projections known as burls 322, that typically support the back side of the substrate. A gap in the burl pattern may be necessary for example to allow an ejector pin, an air duct or some other actuator or sensor to be present on the surface of the substrate support. Of course, such features have been present in substrate tables in the past. However, performance requirements become ever tighter, and anomalies that could be ignored in previous generations of products gradually become significant limitations of the performance and/or yield of the lithographic apparatus as a whole.

Moreover, some modern types of product such as 3-D memory circuits may be particularly susceptible to formation of a hole 322. This is because the formation of dense 3-D structures on the substrate can impart stress patterns not present in more conventional products. Therefore the substrate is less inclined to remain flat in the absence of back side support. It is also mentioned that a gap in the pattern of burls does not necessarily lead to a dip in the wafer surface. The shape is defined by a balance of forces at each location, for example clamping forces versus wafer stress. This might on occasion lead to a bump or, even a height variation of a bump and a dip on a length scale smaller than the area of missing burls.

In another region 330, a bump feature 332 is seen in the surface. This also can have a number of causes. A common cause of bump features is contamination, shown here for example by a contaminant particle 334 trapped between the substrate W and substrate support WT. It is known that the short-range and large amplitude of these types of height anomalies undesirably impacts the focusing of the image, and yield of working products can be impacted negatively as a result. Focus control algorithms can be optimized, either across the substrate or locally in known "trouble spots", to try and achieve successful focusing, and hence successful imaging, even in these areas.

Figure 4:
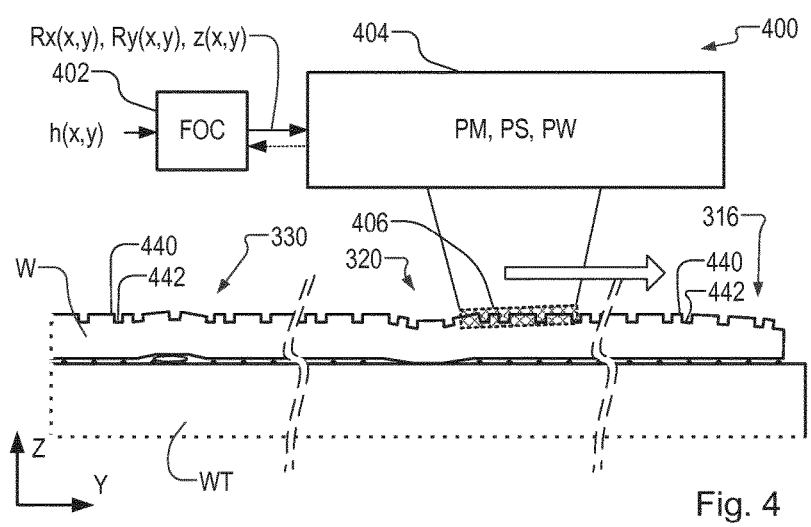
FIG. 4 is a schematic diagram of a focus control operation when applying a pattern to the substrate of FIG. 3, with the addition of device-specific topographic variations.

FIG. 4 illustrates focus control being performed on a substrate having height anomalies of the type described in FIG. 3, after substrate support WT with substrate W has been transferred to the exposure station EXP of the lithographic apparatus of FIG. 1. A focus control system 400 comprises a focus controller 402 (which may be implemented for example as a numerical process within lithographic apparatus control unit LACU) and the apparatus hardware 404. Hardware 404 in this example includes the various components of the positioners PM, PW and the projection system PS shown in FIG. 1. These components have associated sensors and actuators communicating with controller 402.

Using the height map data h(x,y), controller 402 causes the projection system controls the relative positions of the substrate W, the projection system PS and the patterning device MA by a number of servo loops, so that an aerial image 406 of part of a field pattern is accurately focused in the resist layer 312 on substrate W. It will be understood that the one-dimensional cross-section of FIG. 4 is simplified. Assuming a conventional scanning mode of operation, aerial image 406 takes the form of a slit of radiation that extends in both X and Y directions, while forming the focused image in a plane illustrated in cross-section in FIG. 4. In a scanning mode of operation, typically the extent of the imaging slit will be much wider in the slit direction (X) than it is in the scanning direction (Y).

Within certain performance limits, the height of the aerial image 406 can be controlled continuously while the slit scans in the Y direction, to follow a desired set-point profile z(x,y). Similarly, rotations of the image plane around the X and Y axes can also be adjusted continually to follow respective set-point profiles (Rx(x,y) and Ry(x,y)). Assuming conventional arrangement, the x coordinate will not change during each scan, but the x coordinate will change when the apparatus steps to each next field position. Other degrees of control may be provided: the ones mentioned are those relevant to focusing. Typically the extent of the imaging slit will be much wider in the slit direction (X) than it is in the scanning direction (Y).

The set-point profiles Rx(x,y), Ry(x,y), z(x,y) are determined by controller 402 using the height map h(x,y) and an appropriate focus control algorithm FOC. Broadly speaking focus errors inevitably arise across the area of the aerial image 406, because the focal plane is flat and the substrate surface is not flat. The algorithm operates by quantifying the focus error across the slit and adjusting the position and orientation of the image plane until the focus error meets desired criteria. These criteria may include minimizing an average error (for example minimizing a mean square error), and/or staying within a maximum focus error over all or part of the image.

Additional criteria (constraints) may be defined by the dynamic capabilities of the servo control mechanisms. The algorithm may need to sacrifice some focus performance in order not to violate these constraints. The controller may implement a "fall-back" algorithm as one way to do this. In a known fall-back algorithm, if the preferred algorithm yields a set-point profile that violates one of the constraints, then the algorithm is adjusted to average focus errors over a larger slit size (without changing the actual slit size). This will have the effect of averaging topographical variations over a wider area, and so the dynamics of the focal plane will tend to reduce. The fall-back algorithm can be iterative if desired. In an extreme case, the algorithm may decide to average focus errors over the whole field as a single plane. As far as focus control is concerned, this extreme case corresponds in effect to choosing the "stepping" mode of operation mentioned above. No variation of the focal plane is attempted across the whole field.

Referring still to FIG. 4, the substrate in this illustration still shows the edge, hole and bump anomalies in regions 316, 320 and 330. However, the substrate in this example also exhibits a strong device-specific topography. This is represented by high portions 440 and low portions 442 that appear in a regular pattern defined by the device layout and processing effects arising in the formation of functional structures.

As illustrated, both the height amplitude and transverse distance scale of the device-specific features may be comparable to those of the anomalies in regions 316, 320, 330. Consequently, if the focus control algorithm implemented in focus controller 402 is optimized to follow closely the short range variations due to edge effects, holes and bumps, there is a strong chance also that it will follow, or try to follow, the device specific topography. This is generally undesirable for good imaging, as well as for dynamics of the many positioners and components that are involved in imaging. Conversely, if the focus control algorithm implemented in controller 402 is optimized to ignore the short-range variations that are characteristic of the device-specific topography, then its ability to maintain focus in the anomalous regions 316, 320 and 330 will be limited, and yield in those areas will be reduced.

Figure 5:
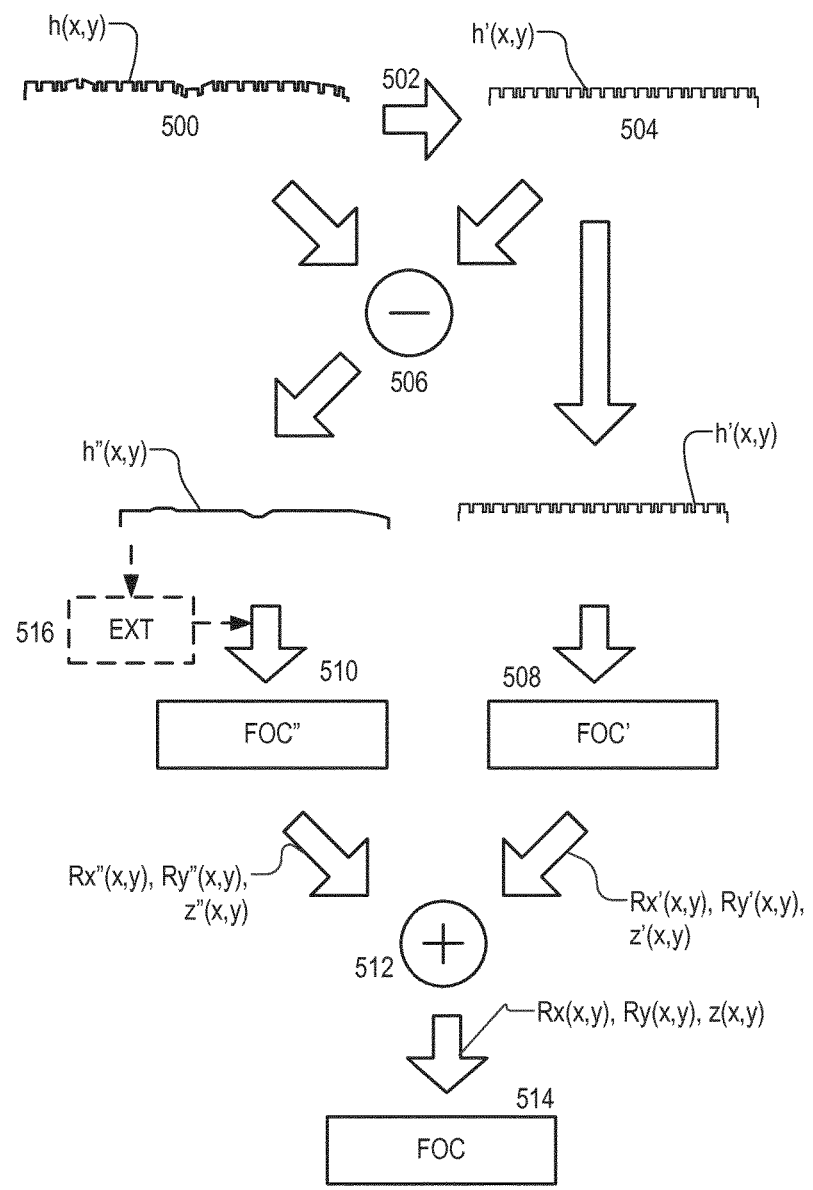
FIG. 5 illustrates steps of a method of controlling focus of the lithographic apparatus in accordance with embodiments of the present invention.

FIG. 5 is a data flow diagram of a modified focus control algorithm that is implemented in the controller 402 of the lithographic apparatus of FIG. 1 according to the present disclosure. This modified algorithm allows focus performance to be optimized under a wider range of conditions than the known algorithms mentioned above. Processing begins at 500 with receipt of the height map h(x,y) for a particular substrate. The height map represents a mixture of long-range and short-range topographic variations, which may include unknown height anomalies and device-specific topography. A first step 502 extracts a device-specific features map h'(x,y) which represents a component of the topography that repeats between fields. A simple way to do this is to compare the topography of each field with a smoothed copy of the height map, and to take the average of the comparison result over a representative sample of the fields. In other words, an average field topography is obtained as a way of obtaining the first height map component that represents topographical variations specific to the device pattern. The device specific topography can be regarded as a kind of intra-field fingerprint and may originate from any of the previously mentioned measurement and/or data sources.

While the device-specific topography can be obtained for a current substrate by calculating an average field topography entirely from the height map of the current substrate, the disclosure is not limited to such a case. The average field topography can be calculated from measurements of multiple substrates of the same product design and processing. The device-specific topography can be obtained wholly or partly with regard to design information and knowledge of the topographical effects of different processes. As mentioned, other types of height sensor can also be brought into use. At the same time, the designer of the apparatus would need to confirm that using these external or historic data improves accuracy and/or reduces processing requirements, compared with simply using the height map of the current substrate, as measured in the lithographic apparatus. These variations will be illustrated further below, with reference to FIG. 6. In any case, the device-specific topography is obtained at step 504.

On a real substrate, the amplitude of the device specific topography may vary slightly over the substrate area. It is a matter of design choice whether the device-specific topography is assumed, as an approximation, to be constant over the whole substrate, or whether, as an alternative, the variation in amplitude is captured and used. In the former case, the device-specific features map h'(x,y) may be reduced to the dimension of a single field, if desired. Also, in the latter case, the device-specific features map could be reduced to a single field multiplied by a scaling factor that varies with position over the substrate. Although in some cases the variation in amplitude may be small over most of the substrate area, device-specific topography may become accentuated in the peripheral fields. Therefore modeling this variation of fingerprint amplitude can be particularly beneficial in cases where edge-related topography and device-specific topography are found together.

At 506 the topography represented in device-specific features map h'(x,y) is subtracted from the measured height map h(x,y) to extract what we may call a "global features" map h"(x,y). This global features map represents a component of topography not associated with the specific device pattern. This component may include the normal long-range height variations, but also any short-range height anomalies (such as bumps, holes, and edge effects) that do not repeat in the same way as the device pattern. In a case where the imaging is performed on the basis of a field pattern that includes a plurality of individual device patterns, it is a matter of design choice whether the device-specific features are identified on the scale of a single device or single field. For the present example, it is assumed that device-specific features are identified on the scale of a field.

Having decomposed the original height map h(x,y) into separate components h'(x,y) and h"(x,y), each component of the height map is then processed by an algorithm specific to that component. Thus in the example of FIG. 5, the focus controller continues at 508 by processing the device-specific features map h'(x,y) using a first focus control algorithm FOC'. The first focus control algorithm FOC' produces a first set of set-point profiles Rx'(x,y), Ry'(x,y), z'(x,y). The controller then at 510 processes the global features map h"(x,y) using a second focus control algorithm FOC". The second focus control algorithm FOC" produces a second set of set-point profiles Rx"(x,y), Ry"(x,y), z"(x,y).

At 512 the set-point profiles are added together to obtain a combined set of set-point profiles Rx(x,y), Ry(x,y), z(x,y). The algorithms FOC' and FOC" are thus summed into an overall focus control algorithm FOC that is implemented by controller 402.

By splitting the device-specific features and the global features into separate components of the height map, for separate processing, the disclosed apparatus allows optimized processing to be implemented for each set of features separately. The first focus control algorithm FOC' produces a first set of set-point profiles Rx'(x,y), Ry'(x,y), z'(x,y) that are optimized for imaging with regard to the device specific topography. The second focus control algorithm FOC" produces a second set of set-point profiles Rx"(x,y), Ry"(x,y), z"(x,y) that are optimized for imaging with regard to the device specific topography. Of course, in the end the focus control is a compromise, but, because the two sets of set-point values are only summed linearly (of course including different weights for each component), there is not the problem that features of one type will be undesirably magnified or suppressed, when one seeks to suppress or magnify features of another type. Moreover, selection of appropriate algorithms becomes much simpler, and the need to optimize algorithms differently for each layer may be reduced also. Additionally, fall-back criteria can be set differently in the different features. In other words, performance in relation to one set of features need not be compromised, just because fall-back is necessary to address challenging topography in the other set of features.

As examples, for the first focus control algorithm FOC', the set-point calculation can be optimized to suppress short-range effects. For example, the algorithm FOC' may be one that minimizes a mean square focus error over a slit area. If the topography is challenging, dynamic constraints may trigger a fall-back algorithm to enlarge the slit for a smoother profile in one or more dimensions. The fall-back criteria can be optimized for the device-specific topography, without compromising the response to bumps, holes and edge effects.

Similarly, the second focus control algorithm FOC" can be optimized to follow short-range topographical variations as far as possible, without compromising the smoothing of device-specific features. It can be optimized to be particularly sensitive to extreme height values within the slit area (or the nominal slit area), without being sensitive to extreme height values that are features of the device-specific topography. For example, to enhance the response to short-range anomalies, algorithm FOC" may be one that minimizes a quartic (fourth power) of the focus errors, or even an eighth power. While such algorithms are known for applying increased weight to the extreme values present in anomaly regions, they could not normally be deployed in the presence of significant device-specific topography. Because the combination of set-points at 512 is linear, the fourth power or eighth power calculations can be employed in algorithm FOC" without amplifying the device-specific topography. Again, fall-back criteria and fall-back responses can be optimized for the global features separately from the device-specific features. In general, therefore, the method disclosed allows the separate calculations to have different degrees of nonlinearity.

Numerous variations of the above examples can be envisaged within the scope of the present disclosure.

Although in the above example, the topographic variations have been decomposed into just two components (h' and h"), there may be cases also where it is useful to decompose the variations into more than two components and allow each of them to have a different focus control algorithm. As an example where this might be useful, one could choose to separate hole and bump type features into a different component from edge-related variations. The non-device specific component h" could be separated into two or more components. In another example, it might be useful to provide different algorithms for handling edge-related variations in different quadrants of the circumference. In particular, because of the different orientation of the edge relative to the slit used for imaging, different criteria should maybe applied to edge-related variations in these different areas. Also with regard to the device-specific topography, one could further separate it into two or more components. One could envisage in this regard identifying and processing separately variations in the X and Y directions. Alternatively or in addition, one could identify separately the variations on a device area basis and a field basis. In any case, the skilled reader can readily extend the concept of the method illustrated in FIG. 5, to provide for three or more components.

Another variation is illustrated as step 516 in FIG. 5. It is often desired to generate extrapolated height data for points beyond the field boundary, particularly in the scanning (Y direction). This is to obtain a smooth control at the beginning and end of the scan of each field. Generally it is desirable for the extrapolation to take account of local height variations (gradients) up to the field edge. Particularly in the peripheral fields, there may not even be height data for parts of the field itself, that fall beyond the substrate edge. Extrapolation will be useful in these cases also, to "fill in" the missing part of the field. However, in examples with strong device-specific topography, to extrapolate on the basis of variations that are actually just device-specific variations would cause a poor performance.

Consequently, in cases with significant device-specific topography, the best option is frequently to base the extrapolation assuming a planar field (similar to the fall-back behavior described above). In the method of FIG. 5, however, the device-specific height variations h' have been separated from the non-device specific component h". The extrapolation step 516 can therefore safely be performed using the component h", without being influenced undesirably by presence of device-specific height variations. In other words, the height map data used for extrapolation excludes the device-specific component of the height map data, and the extrapolated height values are insensitive to topographical variations associated with the device pattern.

In the above example, a simple linear combination of the first and second sets of control set-points is proposed. The focus control set-points calculated in steps 508 and 510 may both be expressed relative to a common reference height and averaged in step 512. Alternatively, the focus control set-points calculated in step 508 may be expressed as deviations from zero, simply added in step 512 to the set-points calculated in step 510.

The combination may apply equal weights to both components, or it may apply unequal weights, according to experience or design. The weighting may also be made automatically responsive to conditions encountered in the measured data or other information used. In the case of averaging, a weighted average may be applied. In the case where one of the control set-points is expressed as a deviation from the other, it may be weighted by applying a scaling factor greater than or less than 1.

In the extreme case where the weighting to be applied to (say) the device-specific set-points would be zero, it would not be necessary to use the device specific component to calculate control set-points at all. Step 508 would be omitted, or replaced by a constant set-point offset. For example, if a most critical region of the device pattern is known to require focusing 20 nm above the general height indicated by the height map, then the first control algorithm FOC' may comprise simply adding a constant height offset. More generally, the calculation at step 508 and/or 510 can be performed to apply enhanced weighting to height values in critical regions defined by the user.

The combination of the two or more sets of control set-points need not be linear. On the other hand the use of a nonlinear combination would bring a particular weighing or de-weighting to extreme set-point values.

Additionally, either or both of the calculations performed in step 508 and 510 can be performed so as to apply enhanced weight to height values in regions of the product design that are identified by a user as critical. Often the finest features, on which the performance of the whole product may depend, are concentrated in a particular region of the device area. Reduced focus performance in other regions may be tolerable without degrading the performance of the finished product.

Figure 6:
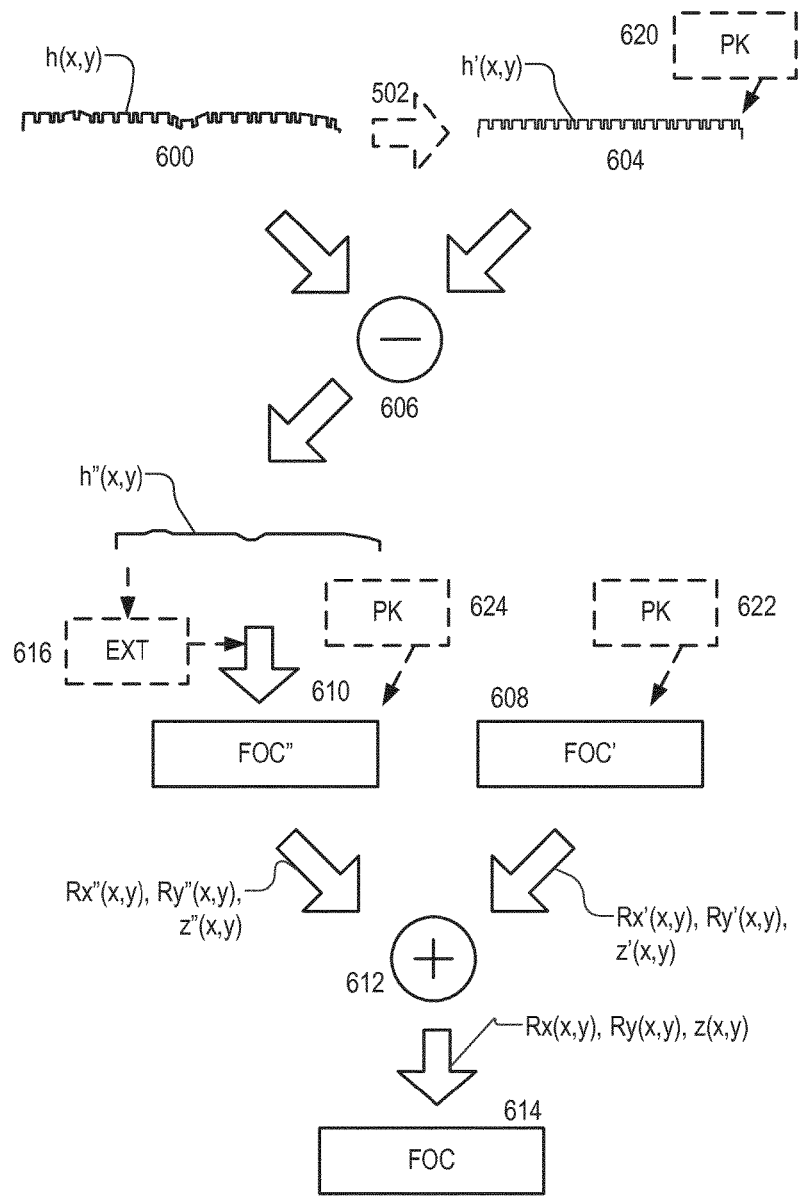
FIG. 6 illustrates some variations of the method of FIG. 5 in accordance with alternative embodiments of the present invention.

FIG. 6 illustrates some of the above variations graphically, without implying that they must all be combined in the same embodiment. Steps labeled 600 to 614 correspond to the like-numbered steps 500-514 in FIG. 5 and will not be described again, except to highlight differences.

As a first variant, in FIG. 6 the device specific topography h'(x,y) obtained at step 604 is not derived, or not entirely derived, from the height map obtained at step 600. At 620 some prior knowledge based on design information and/or measurements of prior substrates is used to define the device specific topography.

As another variant, prior knowledge is obtained in a step 622 and used to influence the calculation of the second first focus control set-points in step 608. As another variant, prior knowledge is obtained in a step 624 and used to influence the calculation of the first focus control set-points in step 610.

As another variant, step 608 is performed to calculate first focus control set-points without reference to the device-specific topography.

In conclusion, by decoupling the set-point calculation with regard to systematic (intrafield) device features from the set-point calculation with regard to global shape and process effects of the substrate, control of imaging parameters such as focus becomes more reliable and simplified. Where previously focus optimization might require a delicate design decision for every individual layer of a product, the decoupling of the calculations increases the chance that a good performance will be obtained with the same algorithms at every layer. Further adjustments can be made in the separate calculations, to optimize performance in each layer, without fear of unexpected side-effects.

The invention may further be described using the following clauses:

1. A method of controlling a lithographic apparatus to manufacture a plurality of devices on a substrate, the method comprising:
   (a) obtaining a height map representing a topographical variation across the substrate; and
   (b) using the height map to control a positioning system of the lithographic apparatus for applying a device pattern at multiple locations across the substrate
   wherein step (b) comprises:
   (b1) decomposing the height map into a plurality of components, including a first height map component representing topographical variations associated with the device pattern and one or more further height map components representing other topographical variations;
   (b2) using each height map component, calculating control set-points according to a control algorithm specific to each component; and
   (b3) combining the control set-points calculated for the first height map component and the further height map component(s) and using the combined set-points to control the positioning system to apply the device pattern to the substrate.

2. A method according to clause 1, wherein the step (b1) comprises calculating the first component of the height map based on an average field topography and subtracting the first component from the height map to obtain said further height map component.

3. A method according to clause 1 or 2, wherein in step (b2) an algorithm specific to the first height map component is less responsive to short-range topographic variations than an algorithm specific to the further height map component.

4. A method according to clause 1, 2 or 3, wherein in step (b2) one or more of the algorithms specific to the different height map components have nonlinearity, while the combining of the control set-points in step (b3) is performed linearly.

5. A method according to any preceding clause, wherein the lithographic apparatus is of a scanning type and wherein the algorithm specific to the first height map component is permitted to consider values from a different sized portion of the field than an algorithm specific to a further height map component.

6. A method according to any preceding clause, wherein the step (b2) includes using the height map data to generate additional height map data by extrapolation, and wherein the height map data used for extrapolation excludes the first height map component so that the extrapolated height map data is insensitive to topographical variations associated with the device pattern.

7. An apparatus for controlling a positioning system of a lithographic apparatus for applying a device pattern at multiple locations across a substrate, the apparatus comprising a data processing apparatus programmed to perform the steps of:
   receiving a height map of a substrate that has been subjected to lithographic processing over a plurality of device areas;
   decomposing the height map into a plurality of components, including a first height map component representing topographical variations associated with the device pattern and one or more further height map components representing other topographical variations;
   using each height map component, calculating control set-points according to a control algorithm specific to each component; and
   combining the control set-points calculated for the first height map component and the further height map component(s) and
   providing set-points to control the positioning system to apply the device pattern to the substrate.

8. An apparatus according to clause 7, wherein for decomposing the height map the processor is arranged to calculate the first component of the height map based on an average field topography and to subtract the first component from the height map to obtain said further height map component.

9. An apparatus according to clause 7 or 8, wherein an algorithm specific to the first height map component is less responsive to short-range topographic variations than an algorithm specific to the further height map component.

10. An apparatus according to clause 7, 8 or 9, wherein one or more of the algorithms specific to the different height map components have nonlinearity, while the combining of the control set-points is performed linearly.

11. An apparatus according to any of the clauses 7 to 10, wherein the lithographic apparatus is of a scanning type and wherein the algorithm specific to the first height map component is permitted to consider values from a different sized portion of the field than the algorithm specific to the further height map component.

12. An apparatus according to any of the clauses 7 to 11, wherein the calculating of control set-points for at least one of the components includes using the height map data to generate additional height map data by extrapolation, and wherein the height map data used for extrapolation excludes the first height map component, so that the extrapolated height map data is insensitive to topographical variations associated with the device pattern.

13. A method of controlling a lithographic apparatus to manufacture a plurality of devices on a substrate, the method comprising:

(a) obtaining a height map representing a topographical variation across the substrate; and (b) using the height map to control a positioning system of the lithographic apparatus for applying a device pattern at multiple locations across the substrate wherein step (b) comprises:

(b1) subtracting from the height map a first height map component representing topographical variations associated with the device pattern so as to obtain one or more further height map components representing other topographical variations;

(b2) using the obtained height map component(s), calculating control set-points according to a control algorithm specific to the other topographical variations; and (b3) using the calculated set-points to control the positioning system to apply the device pattern to the substrate.

14. An apparatus for controlling a positioning system of a lithographic apparatus for applying a device pattern at multiple locations across a substrate, the apparatus comprising a data processing apparatus programmed to perform the steps of:

receiving a height map of a substrate that has been subjected to lithographic processing over a plurality of device areas;

subtracting from the height map a first height map component representing topographical variations associated with the device pattern so as to obtain one or more further height map components representing other topographical variations;

using the obtained height map component(s), calculating control set-points according to a control algorithm specific to the other topographical variations; and combining the control set-points calculated for the first height map component and the further height map component(s) and providing set-points to control the positioning system to apply the device pattern to the substrate.

15. A lithographic apparatus comprising a projection system and positioning system for positioning a patterning device and substrate in relation to the projection system for applying a pattern to a substrate, the lithographic apparatus being arranged to control the positioning system by a method according to any of the clauses 1 to 6 and 13.

16. A lithographic apparatus comprising a projection system and positioning system for positioning a patterning device and substrate in relation to the projection system for applying a pattern to a substrate, the lithographic apparatus including apparatus according to any of the clauses 7 to 12 and 14 for controlling the positioning system.

17. A computer program product comprising machine readable instructions for causing a general purpose data processing apparatus to perform the steps of a method according to any of the clauses 1 to 6 and 13.

18. A computer program product comprising machine readable instructions for causing a general purpose data processing apparatus to implement the apparatus according to any of the clauses 7 to 12 and 14.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the spirit and scope of the claims set out below. In addition, it should be appreciated that structural features or method steps shown or described in any one embodiment herein can be used in other embodiments as well.

The invention claimed is:

1. A method comprising:

obtaining a height map representing a topographical variation across a substrate; and using the height map to control a positioning system of a lithographic apparatus for applying a product pattern at multiple locations across the substrate, wherein using the height map comprises:

decomposing the height map into a plurality of components, including a first height map component representing topographical variations associated with a device pattern and a second height map component representing other topographical variations;

using each of the first and second height map components, calculating control set-points according to a control algorithm specific to each of the first and second height map components;

combining the control set-points calculated for the first height map component and the second height map component; and using the combined set-points to control the positioning system to apply the product pattern to the substrate.

2. The method as claimed in claim 1, wherein the decomposing the height map comprises calculating the first component of the height map based on an average field topography and subtracting the first component from the height map to obtain the second height map component.

3. The method as claimed in claim 1, wherein in the calculating control set-points an algorithm specific to the first height map component is less responsive to short-range topographic variations than an algorithm specific to the second height map component.

4. The method as claimed in claim 1, wherein in the calculating control set-points one or more of the algorithms specific to the different height map components have non-linearity, while the combining of the control set-points is performed linearly.

5. The method as claimed in claim 1, wherein the lithographic apparatus is of a scanning type and wherein the algorithm specific to the first height map component is permitted to consider values from a different sized portion of a field than an algorithm specific to the second height map component.

6. The method as claimed in claim 1, wherein the calculating a control set-point for at least one of the height map components includes using the height map data to generate additional height map data by extrapolation, and wherein the height map data used for extrapolation excludes the first height map component so that the extrapolated height map data is insensitive to topographical variations associated with the device pattern.

7. An apparatus comprising a data processing apparatus programmed to at least:
  receive a height map of a substrate that has been subjected to lithographic processing;
  decompose the height map into a plurality of components, including a first height map component representing topographical variations associated with a device pattern and a second height map component representing other topographical variations;
  using each of the first and second height map components, calculate control set-points according to a control algorithm specific to each of the first and second height map components;
  combine the control set-points calculated for the first height map component and the second height map component; and
  provide a set-point, based on the combination of the control set-points, to control a positioning system of a lithographic apparatus configured to apply a product pattern at multiple substrate locations.

8. The apparatus as claimed in claim 7, wherein, to decompose the height map, the data processing apparatus is arranged to calculate the first component of the height map based on an average field topography and to subtract the first component from the height map to obtain the second height map component.

9. The apparatus as claimed in claim 7, wherein an algorithm specific to the first height map component is less responsive to short-range topographic variations than an algorithm specific to the second height map component.

10. The apparatus as claimed in claim 7, wherein one or more of the algorithms specific to the different height map components have nonlinearity, while the combination of the control set-points is performed linearly.

11. The apparatus as claimed in claim 7, wherein the lithographic apparatus is of a scanning type and wherein the algorithm specific to the first height map component is permitted to consider values from a different sized portion of a field than the algorithm specific to the second height map component.

12. The apparatus as claimed in claim 7, wherein the calculation of a control set-point for at least one of the height map components includes using the height map data to generate additional height map data by extrapolation, and wherein the height map data used for extrapolation excludes the first height map component, so that the extrapolated height map data is insensitive to topographical variations associated with the device pattern.

13. A method comprising:
  obtaining a height map representing a topographical variation across a substrate; and
  using the height map to control a positioning system of a lithographic apparatus for applying a product pattern at multiple locations across the substrate, wherein using the height map comprises:
    subtracting from the height map a first height map component representing topographical variations associated with a device pattern so as to obtain a second height map component representing other topographical variations;
    using the obtained second height map component, calculating control set-points according to a control algorithm specific to the other topographical variations; and
    using the calculated set-points to control the positioning system to apply the product pattern to the substrate.

14. An apparatus comprising a data processing apparatus programmed to at least:
  receive a height map of a substrate that has been subjected to lithographic processing;
  subtract from the height map a first height map component representing topographical variations associated with a device pattern so as to obtain a second height map component representing other topographical variations;
  using the obtained second height map component, calculate control set-points according to a control algorithm specific to the other topographical variations;
  combine the control set-points calculated for the first height map component and the second height map component; and
  provide a set-point, based on the combination of the control set-points, to control a positioning system of a lithographic apparatus configured to apply a product pattern at multiple substrate locations.

15. A non-transitory computer program product comprising machine readable instructions therein that, when executed, are configured to cause a general purpose data processing apparatus to at least:
  obtain a height map representing a topographical variation across a substrate; and
  use the height map to control a positioning system of a lithographic apparatus for applying a product pattern at multiple locations across the substrate, wherein use of the height map comprises:
  (a) decomposition of the height map into a plurality of components, including a first height map component representing topographical variations associated with a device pattern and a second height map component representing other topographical variations, calculation of control set-points according to a control algorithm specific to each of the first and second height map components, combination of the control set-points calculated for the first height map component and the second height map component, and use of the combined set-points to control the positioning system to apply the product pattern to the substrate, or
  (b) subtraction from the height map a first height map component representing topographical variations associated with a device pattern so as to obtain a second height map component representing other topographical variations, calculation of control set-points, using the obtained second height map component, according to a control algorithm specific to the other topographical variations, and use of the calculated set-points to control the positioning system to apply the product pattern to the substrate.

16. The computer program product of claim 15, wherein use of the height map comprises: decomposition of the height map into a plurality of components, including a first height map component representing topographical variations associated with the device pattern and a second height map component representing other topographical variations, calculation of control set-points according to a control algorithm specific to each of the first and second height map components, combination of the control set-points calculated for the first height map component and the second height map component, and use of the combined set-points to control the positioning system to apply the product pattern to the substrate.

17. The computer program product of claim 16, wherein the decomposition of the height map comprises calculation of the first component of the height map based on an average field topography and subtraction of the first component from the height map to obtain the second height map component.

18. The computer program product of claim 15, wherein use of the height map comprises: subtraction from the height map a first height map component representing topographical variations associated with the device pattern so as to obtain a second height map component representing other topographical variations, calculation of control set-points, using the obtained second height map component, according to a control algorithm specific to the other topographical variations, and use of the calculated set-points to control the positioning system to apply the product pattern to the substrate.

19. A lithographic apparatus comprising a projection system and a positioning system configured to position a patterning device and substrate in relation to the projection system in order to apply a pattern to a substrate, the lithographic apparatus comprising the apparatus of claim 7 to control the positioning system.

20. A lithographic apparatus comprising a projection system and a positioning system configured to position a patterning device and substrate in relation to the projection system in order to apply a pattern to a substrate, the lithographic apparatus comprising the apparatus of claim 14 to control the positioning system.

* * * * *